US006462396B2

(12) United States Patent
Lemaire

(10) Patent No.: US 6,462,396 B2
(45) Date of Patent: Oct. 8, 2002

(54) INDUCTANCE STRUCTURE ON SEMICONDUCTOR SUBSTRATE

(75) Inventor: Frédéric Lemaire, Saint Egreve (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/737,619

(22) Filed: Dec. 14, 2000

(65) Prior Publication Data

US 2001/0015473 A1 Aug. 23, 2001

(30) Foreign Application Priority Data

Dec. 15, 1999 (FR) ........................................... 99 15840

(51) Int. Cl.[7] ................................................ H01L 29/00

(52) U.S. Cl. ....................................... 257/531; 438/381

(58) Field of Search ................................ 257/531, 528; 438/238, 381

(56) References Cited

U.S. PATENT DOCUMENTS 5,717,243 A * 2/1998 Lowther ..................... 257/531
5,936,299 A * 8/1999 Burghartz et al. .......... 257/531
6,124,624 A * 9/2000 Van Roosmalen et al. .. 257/531
6,310,387 B1 * 10/2001 Seefeldt et al. ............. 257/531

FOREIGN PATENT DOCUMENTS

EP 0 780 853 6/1997
WO WO 98/50956 11/1998

* cited by examiner

*Primary Examiner*—David Nelms
*Assistant Examiner*—Quoc Hoang
(74) *Attorney, Agent, or Firm*—Lisa K. Jorgenson; Robert Iannucci; Seed IP Law Group PLLC

(57) ABSTRACT

An inductance structure arranged on a semiconductor substrate, including an inductance and a conductive plane arranged between the inductance and the substrate. The conductive plane is formed of several separate conductive elements, the connection of which is performed by conductive tracks connecting at least one conductive element to a contact point M of the conductive plane. Each of the conductive tracks is arranged so that the resultant of the electromotive forces induced in said conductive track by the inductance is substantially null.

22 Claims, 5 Drawing Sheets

INDUCTANCE STRUCTURE ON SEMICONDUCTOR SUBSTRATE

TECHNICAL FIELD

The present invention relates to the field of integrated circuits, and more specifically to an inductance formed above a semiconductor substrate.

BACKGROUND OF THE INVENTION

FIG. 1 shows an inductance 1, including a number of turns or spirals, formed by a conductive element deposited on an insulating layer 2. Insulating layer 2, for example silicon oxide, rests on a semiconductor substrate 3, generally made of silicon, which is connected to ground by its lower surface 4 in the example shown.

A strong disadvantage of the inductance of FIG. 1 is that it has high losses. Thus, there exists a capacitance C with respect to the substrate, insulating layer 2 behaving as a dielectric. Further, substrate 3 is resistive and it exhibits a resistance R between its upper and lower surfaces 5 and 4. Thus, when a variable current flows in inductance 1, losses occur due to capacitance C and resistance R. These losses have the disadvantage of strongly decreasing quality factor Q of the inductance.

To overcome this disadvantage, European patent application EP-A-0780853 provides an inductance structure on a silicon substrate including a conductive plane located between the inductance and the substrate. This conductive plane, insulated from the substrate and the inductance, is connected to ground or to a cold point of the circuit, to establish an "electromagnetic shield or screen" between the inductance and the semiconductor substrate. To avoid dissipation by the creation of eddy currents in the conductive plane, said application provides dividing up the conductive plane.

A type of inductance with a divided inductive plane according to an example of the above-mentioned application is illustrated in FIG. 2.

FIG. 2 illustrates an inductance 1, an insulating layer 2, and a substrate 3 having an upper surface 5 and a lower surface 4 connected to ground. FIG. 2 also illustrates, above insulating layer 2, a conductive plane 10. Conductive plane 10 is divided in longitudinal strips 12 connected to a lateral strip 13 perpendicular to strips 12 and having, at its middle, a node 11 connected to ground. The effect of eddy currents is thus strongly decreased, but the structure of FIG. 2 has disadvantages.

Thus, in FIG. 2, when inductance 1 is run through by a variable current, an electromotive force e due to the inductive coupling existing between strips 12 and the inductance appears in each of said strips. Similarly, an electromotive force e' due to the inductive coupling between strip 13 and inductance 1 appears in lateral strip 13. These electromotive forces cause losses. Indeed, each of the points of strips 12 and 13 is at a nonzero potential with respect to ground, due to induced electromagnetic forces, and, thereby, losses occur via a capacitance due to layer 2 used as a dielectric and the ohmic resistance of the substrate, these capacitance and ohmic resistance being distributed magnitudes, different at each point of the conductive plane.

All these losses make the behavior of the structure of FIG. 2 unsatisfactory and decrease quality factor Q of the inductance.

The above-mentioned patent application provides other ways of dividing the conductive plane (see FIGS. 7, 9, and

12 of this application). However, in all the provided examples of said application, including in its preferred embodiment corresponding to FIG. 7, there remain conductive plane portions in which a high induced electromotive force causes the undesirable effect that has been described.

SUMMARY OF THE INVENTION

Therefore, an object of the present invention is to provide an inductance structure arranged on a semiconductor substrate that does not have the above-described disadvantages.

Another object of the present invention is to provide an inductance structure arranged on a semiconductor substrate that minimizes losses due to the inductance operation.

Another object of the present invention is to provide an inductance structure that minimizes the electromotive forces induced in the conductive plane.

To achieve these objects as well as others, one embodiment of the present invention provides an inductance structure arranged on a semiconductor substrate, including an inductance and a conductive plane arranged between the inductance and the substrate. The conductive plane includes several separate conductive elements and several conductive tracks, each conductive track connecting at least one conductive element to a contact point M of the conductive plane. Each of the conductive tracks is arranged so that the resultant of the electromotive forces induced therein by said inductance is substantially null.

According to an embodiment of the present invention, each of the conductive tracks substantially follows an axis of symmetry of the inductance.

According to an embodiment of the present invention, the inductance substantially has the shape of a square and the conductive tracks are arranged along the diagonal and median lines of said square.

According to an embodiment of the present invention, the inductance substantially has the shape of a circle and the conductive tracks are arranged along the radiuses of said circle.

According to an embodiment of the present invention, said conductive elements have an elongated shape and are arranged perpendicularly to a spiral portion under which they are laid.

According to an embodiment of the present invention, said conductive elements are arranged under the inductance spirals only.

BRIEF DESCRIPTION OF THE DRAWINGS

The foregoing objects, features and advantages of the present invention, will be discussed in detail in the following non-limiting description of specific embodiments in connection with the accompanying drawings.

DETAILED DESCRIPTION OF THE INVENTION

Figure 3A:
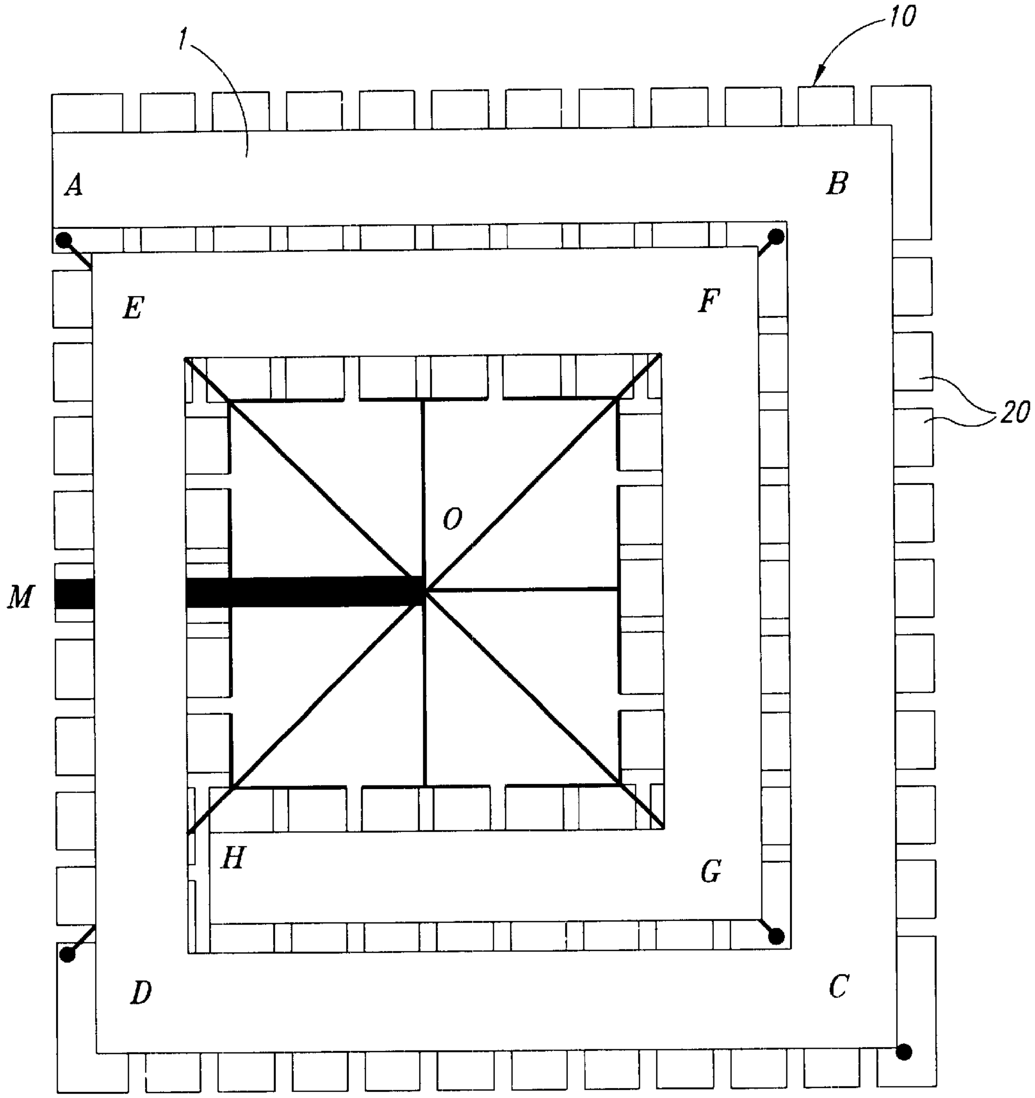
FIG. 3A shows an inductance structure according to the present invention.

FIG. 3A shows an inductance structure according to the present invention. In FIG. 3A, an inductance 1 is formed of one spiral and three quarters, the spirals being here shown in the form of rectilinear spirals. Thus, inductance 1 is formed of rectilinear conductive spiral portions AB, BC, CD, DE, EF, FG, and GH. FIG. 3A also shows, under inductance 1, a conductive plane 10.

According to the present invention, conductive plane 10 is formed of separate conductive elements 20, isolated from one another. Conductive elements 20 which, in the example shown, have the shape of substantially rectilinear strips, may be formed in different ways, for example by etching a metal layer or by having heavily-doped layers diffuse into the substrate. The fact that the conductive plane is formed of distinct elements isolated from one another has the advantage of enabling a great flexibility for their connection, which flexibility is taken advantage of in the structure of the present invention. Elements 20 are connected to a contact point M by conductive tracks, further described in relation with FIG. 3B. Contact point M enables connection of the conductive plane and is connected to ground or to any "cold" point of the circuit.

For simplicity, FIG. 3A shows neither the necessary insulating layers, nor the substrate on which the inductance structure is laid.

Figure 3B:
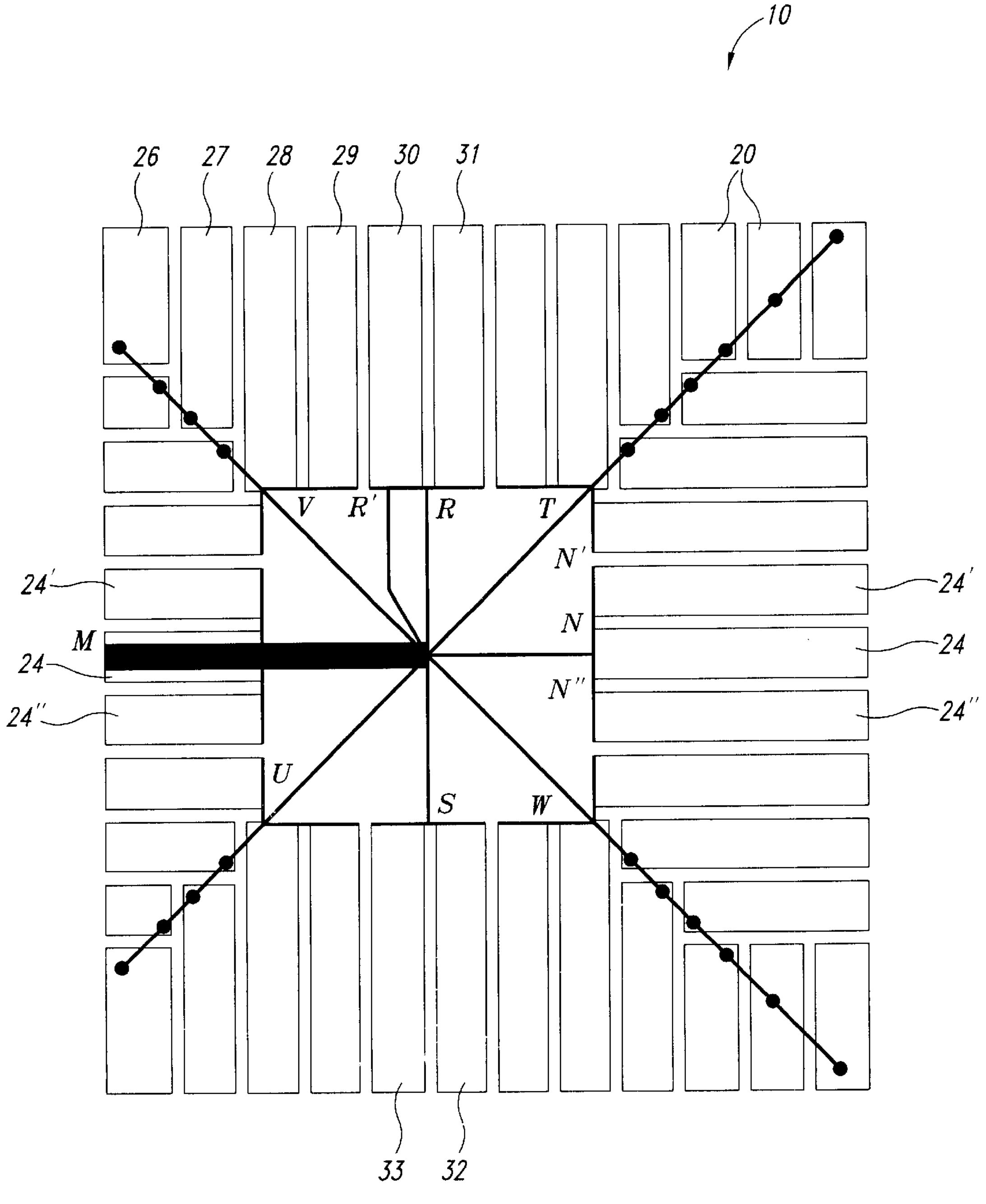
FIG. 3B shows a conductive plane belonging to the structure of FIG. 3A.

FIG. 3B is similar to FIG. 3A, but inductance 1 has been removed to better show elements 20 of conductive plane 10, as well as the conductive tracks that connect elements 20 to contact point M.

As indicated hereinabove, elements 20 have a substantially rectangular elongated shape. They are arranged perpendicularly to the spiral portion(s) under which they are laid. Their width is small, to limit their surface to reduce the eddy current which, although small, are present. Preferably, the width is chosen to be as small as possible, while being careful not to decrease the efficiency of elements 20 in their function as an electrostatic screen. The length of conductive elements 20 is sufficient to run on either side of the considered spiral portion, by extending slightly beyond the most internal spiral and the most external spiral. Elements 20 are thus longer or shorter, according to the number of spirals crossed. Thus, element 24 of FIG. 3B, placed under the central portion of spiral portions BC and FG is longer than element 25, placed under the central portion of spiral portion DE, since the number of spirals placed above is smaller for the latter.

Under the central spiral portions, all adjacent elements 20 have the same length and the same width in the example shown. Under the inductance summits, however, elements 20, still perpendicular to the spiral portion under which they are laid, are shorter since they encounter elements 20 on the adjacent side. Thus, conductive elements 26, 27 of FIG. 3B are shorter than conductive elements 28, 29, of same length as elements 30, 31, located at the center of spiral portions AB and EF. It should however be noted that the representation of FIG. 3B is an example only, and that other ways of arranging conductive elements 20 are possible without departing from the field of the present invention.

It should further be noted that elements 20 of conductive plane 10 do not extend in the central inductance region, in order to limit their surface to reduce losses by eddy currents.

It should also be noted that the shape and arrangement of elements 20 of FIGS. 3A, 3B is an example only, and that other shapes and arrangements of separate elements 20 are possible without departing from the field of the present invention.

FIG. 3B also illustrates in detail the connections of conductive elements 20 to contact point M. Point M is connected to a point O corresponding to the center of inductance 1 by a conductive track MO, which connects to point M elements 25, 25', and 25". Various other conductive tracks pass through point O and connect a small number of elements 20. Thus, the extension of track MO, track ON, connects elements 24, 24', and 24". A track RS connects elements 30, 31, 32, 33. Similarly, tracks VW and TU, in diagonal on FIG. 3B, connect the remaining elements 20, located under the summits of inductance 1.

Preferably, these conductive tracks have a minimum width, compatible with the maximum tolerable resistance that they can exhibit.

It should be noted that tracks RS, TU, MN, and VW are not limited to rectilinear segments defined by the above points, but that they are arranged to efficiently connect elements 20, for example as indicated in thick lines on FIG. 3B. Thus, track ON further includes two segments NN', NN" perpendicular to ON, to connect elements 24' and 24".

It should also be noted that node O is common to all tracks which, due to track OM, are all electrically connected to contact point M, and thus form, with separate elements 20, conductive plane 10. It should also be noted that in practice, track OM is wider than the other tracks, to be able to efficiently drain, if necessary, residual currents to the outside of the conductive plane.

The arrangement of the conductive tracks connecting elements 20 has been chosen so that the resultant of the electromotive forces induced in the conductive tracks is substantially null.

To better understand the choice made, the behavior of the inductance structure according to the present invention when the inductance is run through by a variable current i will be described in relation with FIGS. 3A and 3B.

First, due to the fact that the conductive plane is formed of separate conductive elements of small size, the problem of eddy currents, which however exist in each of conductive elements 20 (and not in the conductive tracks, of negligible surface), is practically solved and the only problem to be envisaged is that due to induced electromotive forces.

Generally speaking, the electromotive force induced in a first conductor by a second conductor run through by a variable current i has value $e = -M.di/dt$, M being the mutual inductance coefficient between the two conductors and di/dt being the variation, in time, of current i flowing through the second conductor.

For two parallel rectilinear conductors, the mutual inductance coefficient depends on the length of the conductors and on their distance, M being all the greater as the length of the conductors is large and as their distance is small. If the conductors are not parallel but form a given angle, their mutual inductance coefficient M is proportional to the cosine of the angle formed by the two conductors. Finally, when two conductors are perpendicular (their angle is 90°), their mutual inductance coefficient is null.

Thus, to reduce the electromotive forces induced in the conductive tracks, and thus the losses undergone by inductance 1, three types of configurations are implemented, as far as possible.

According to a first configuration, a track or a section of conductive track is perpendicular to the spiral portions, which results in a null mutual inductance and in a null induced electromotive force as well.

According to a second configuration, a track or a section of conductive track is parallel to at least two spiral portions, and at equal distance between said spirals. This amounts to placing the tracks at the center of the inductance and, since each spiral of the inductance includes portions run through by a current of same absolute value and of inverse direction, the considered tracks have a mutual inductance formed of two components, one positive and one negative component, which subtract and exactly cancel each other out if the number of spiral portions is the same on each side.

According to a third configuration, used for the inductance summits, a track or a portion of conductive track is arranged along the bisecting line of the angle formed by spiral portions. These spiral portions (respectively directed towards or in the opposite direction to the summit of the angle that they form), the resulting mutual inductance between these spiral portions and the considered track or track section is also null, as well as the resulting electromotive force induced in the considered track or track section.

Now referring to FIGS. 3A and 3B, the inductive coupling between the different conductive tracks of the present invention and each of the spiral portions of inductance 1, and the electromotive forces that these spiral portions generate in a track when the inductance is run through by a variable current, will thus be considered.

Track MO is perpendicular to spiral portions DE, FG, and BC. The mutual inductance coefficient between these spiral portions and track MO is thus null, and the electromotive force created in MO by these spiral portions is null. Further, track MO is parallel to spiral portions AB, CD, EF, and GH, and is located between these spiral portions, at equal distance therefrom. A first induced electromotive force due to portions AB and EF is present in track MO, but this electromotive force is compensated by a second electromotive force induced by spiral portions CD and GH, whereby the resultant of the electromotive forces created by spiral portions AB, CD, EF, and GH is null. Thus, no resultant electromotive force is present in track MO and node O is exactly at the same potential as point M.

Similarly, a null resultant electromotive force is present in track ON, which is perpendicular to spiral portions BC, FC, and DE and parallel to spiral portions AB, CD, EF, and GH, and at equal distance therebetween, and point N is at the same potential as point M.

Track OR is perpendicular to spiral portions AB, CD, EF, and GH. No induced electromotive force will thus result in track OR due to these spiral portions. Track OR is further parallel to spiral portions BC, DE, and FG. Since track OR is located exactly in the middle of spirals DE and FG, the action of these spiral portions substantially compensates. However, the influence of spiral portion BC is not compensated, due to the fact that inductance 1 is not symmetrical and that it does not have an integral number of spirals. The distance between track OR and spiral portion BC being large enough, the electromotive force induced in track RO remains low. However, node R is at a given potential with respect to node O, and thus to node M, which generates losses. Similarly, a residual electromotive force due to the inductance dissymmetries is present in track SO and point S is at a potential different from that of nodes O and M.

Track TO is substantially located on the bisecting line of the angle formed by spiral portions AB and BC on the one hand, EF and FG on the other hand. This case is that of one of the above-described configurations and, since the same current flows towards point B and F to subsequently flow away therefrom, two compensating electromotive forces are present in track TO and their resultant is null. The action of spiral portions CD, DE, and GH, which partly compensate and which are distant enough from TO can be neglected as a first approximation. The same can be said for track WO, forming the bisecting line of the angle formed by spiral portions BC and CD, and FG and GH, respectively.

However, tracks VO and UO, still due to dissymmetries of the inductance, do not exactly follow the bisecting line of the angles formed by spiral portions. The compensation is not perfect and a potential with respect to node O and, accordingly, to node M, appears at node V and at node U.

Thus, due to the structure of the present invention, the resultants of the electromotive forces induced in the various conductive tracks connecting the various conductive elements 20 appear to be null or close to zero. In fact, if the inductance was perfectly symmetrical, the above-described structure would allow perfect compensation of the electromotive forces induced in the conductive tracks. Before describing a way of further reducing the residual electromotive forces present in the tracks, the significant advantage of the fact that the connection points of elements 20 are at a potential substantially equal to that of contact node M will be described.

Figure 1:
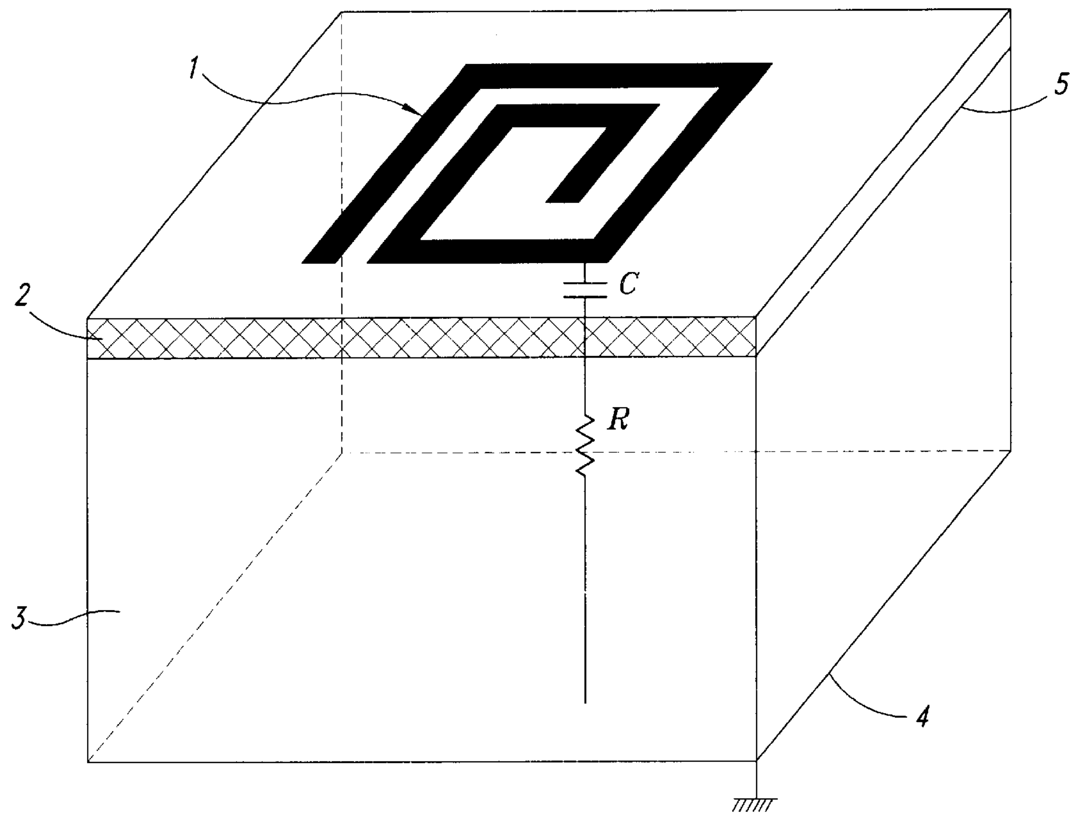
Fig. 1 (Prior Art)
FIG. 1, previously described, shows an inductance deposited on a semiconductor substrate according to prior art.
Figure 2:
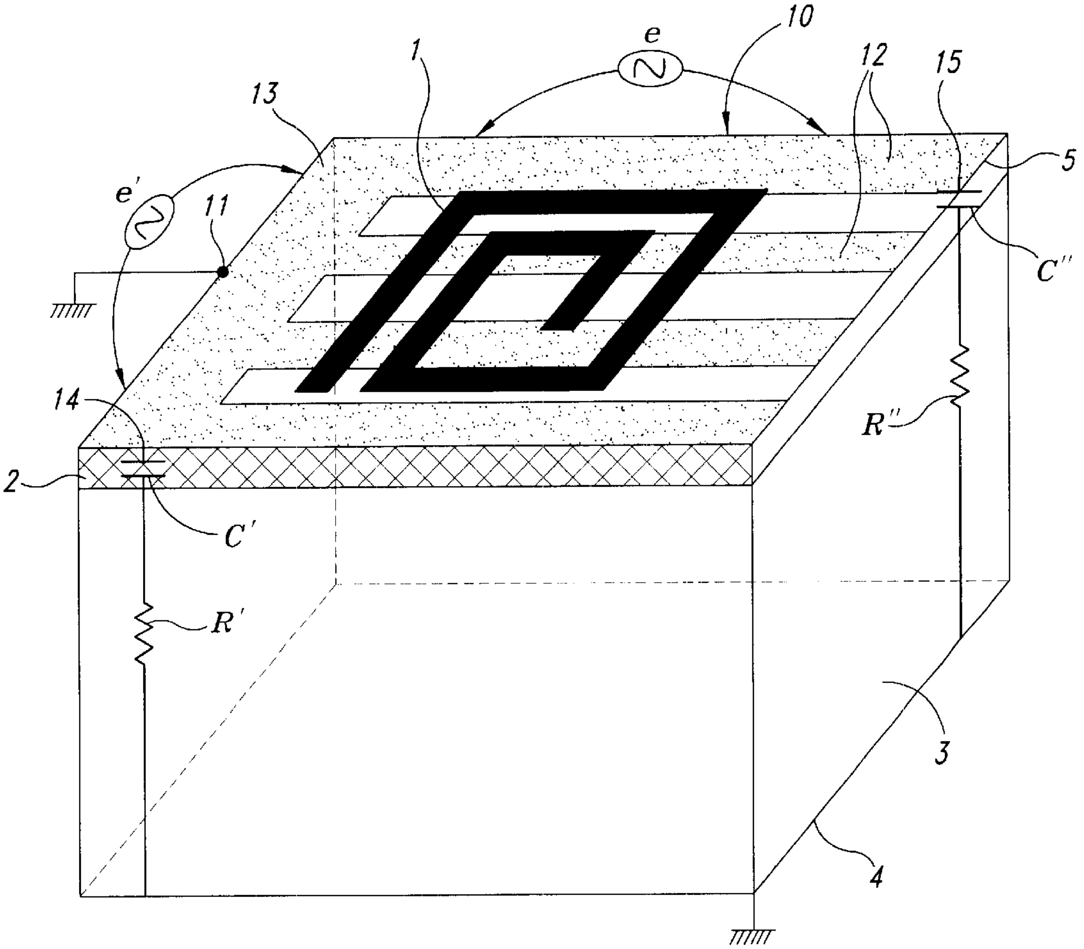
Fig. 2 (Prior Art)
FIG. 2, previously described, shows another inductance structure deposited on a semiconductor substrate according to the prior art.

Thus, referring back to FIG. 2, high electromotive forces e' and e are present in strip 13 and both peripheral strips 12, due to their following a significant length spiral portions separated by only a small distance. Node 14, at one end of strip 13, thus is at potential e'/2 with respect to node 11 and node 15, at the end of peripheral strip 12, is at potential e"=e+e'/2. Capacitances, respectively C' and C", located between the conductive plane and the substrate, and resistances, respectively R' and R", of the substrate, are present under nodes 14 and 15. Capacitances C', C" and resistances R', R" are distributed capacitances and resistances, the value of which depends on many parameters. In capacitances C' and C" flows a current i' and i", the value of which is, due to the fact that resistances R' and R" are small in practice as compared to the impedance of capacitances C' and C", respectively i'=C'.de'/dt and i"=C".de"/dt, de'/dt and de"/dt respectively representing the variations of voltages e' and e" in time. Currents i' and i" cause losses by Joule effect in the substrate, respectively equal to $R'.i'^2$, and $R''.i''^2$, all the greater as voltages e' and e" are high.

According to the present invention, however, the tracks connecting elements of the conductive plane are arranged so that the resultant of the electromotive forces induced in said tracks is substantially null. This means that the connection point between a conductive element 20 and the conductive track that connects it is at a substantially null potential. Thus, although electromotive forces are induced in most conductive elements (only elements 24 and 25 are totally free from it in the example shown), the maximum potential difference between node M and each of the nodes of a conductive element 20 remains substantially limited by the value of the electromotive force induced in said element, which is anyway low due to the fact that the conductive elements are perpendicular to the spiral portions and that their length is small. This accordingly limits the current flowing through the capacitance located under elements 20 and therefore limits ohmic losses in the substrate, and this significantly as compared to prior art, where the connection of the portions of conductive plane is often performed at the periphery.

However, as mentioned hereinabove, a residual electromotive force, mainly due to the inductance dissymmetry, remains in some conductive tracks connecting the different elements of the conductive plane, for example in track RO, preventing the potential of node R with respect to node M to be absolutely null. It is possible to reduce this residual electromotive force. Indeed, there exist electromagnetic simulation tools enabling, from the various system parameters, calculation of the mutual inductance coefficient between inductance 1 taken as a whole and a specific track path. For example, for track RO, a track R'O, located between track RO and track VO more strongly undergoes the influence of spiral portion DE, and accordingly is probably better, in terms of induced electromotive force resultant, than track RO. It is possible to use the abovementioned electromagnetic simulation tool to evaluate the performance of one or several tracks R'O shifted with respect to track RO and to choose that for which the resultant of the electromotive forces induced therein is the closest to zero. This provides a variant of the pattern of the conductive tracks and it is possible to thus obtain many track path possibilities, which improve the conductive plane of FIG. 3B. However, they require a rather complex calculation, which is not always necessary. Thus, in the case of FIG. 3A where inductance 1 is almost symmetrical, the conductive plane of FIG. 3B satisfactorily provides the described advantages without requiring any additional correction.

Of course, the inductance structure illustrated in FIGS. 3A and 3B is an example only and the present invention is likely to have various alterations, modifications, and improvements which will readily occur to those skilled in the art. In particular, it should be noted that conductive elements 20 are arranged just under the location of the spirals of inductance 1, and scarcely extend therebeyond. However, this feature is not essential and the elements of the conductive plane could extend more widely under the inductance without departing from the field of the present invention.

Further, the example of FIGS. 3A and 3B shows a square inductance including one spiral and three quarters. Of course, the present invention can be applied whatever the number of spirals of the inductance, and whatever the inductance shape.

Thus, if the spirals are rectangular, the elements of the conductive plane may be rectangles, as in the present case, and the conductive tracks will follow, except for corrections due to the inductance dissymmetries, the median and diagonal lines of the rectangle.

Figure 3C:
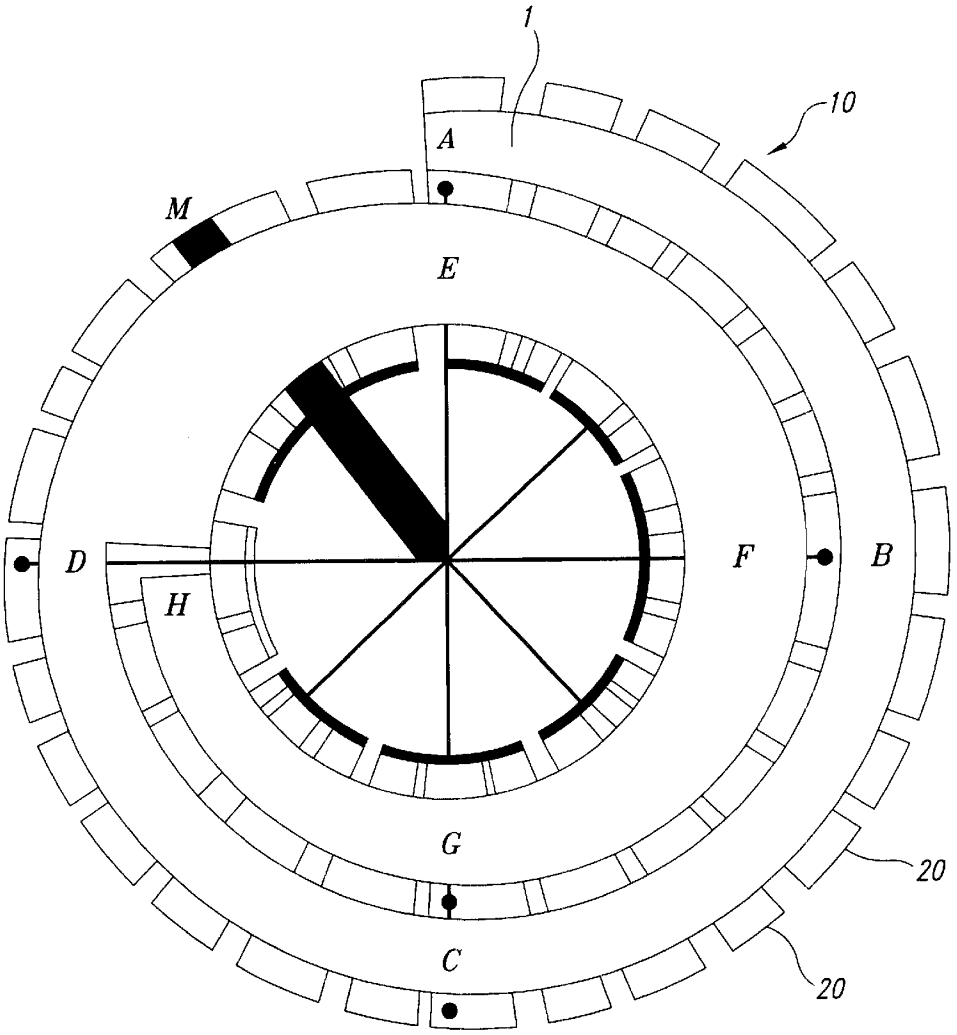
FIG. 3C shows an inductance structure according to the present invention.

If the inductance spirals are circular or in a spiral and have a center O as shown in FIG. 3C, elements 20 of conductive plane 10 may still have a rectangular shape, but they will preferably have either a trapezoidal shape limited by radiuses of center O, or they will be portions of circular sectors of center O. However that may be, these elements will be radially arranged, and their connection to the center will be done by conductive tracks also radially arranged, such a structure, as it is perfectly symmetrical, having minimal losses.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductance structure arranged on a semiconductor substrate, comprising: an inductance; and a conductive plane arranged between the inductance and the substrate, the conductive plane including several separate conductive elements and several conductive tracks, each conductive track connecting at least one conductive element to a contact point of the conductive plane, wherein each of the conductive tracks is arranged so that the resultant of the electromotive forces induced therein by said inductance is substantially null.

2. The inductance structure of claim 1, wherein each of the conductive tracks substantially follows an axis of symmetry of the inductance.

3. The inductance structure of claim 2, wherein the inductance further comprises a substantially spiral shape.

4. The inductance structure of claim 3, wherein the inductance further comprises a substantially squared-spiral shape and the conductive tracks are arranged along diagonal and median lines of said squared-spirally shaped inductance.

5. The inductance structure of claim 3, wherein the inductance further comprises a substantially rectangularly-spiral shape and the conductive tracks are arranged along diagonal and median lines of said rectangularly-spiral shaped inductance.

6. The inductance structure of claim 3, wherein the inductance further comprises a substantially circular shape and the conductive tracks are arranged along the radii of said circularly shape inductance.

7. The inductance structure of claim 3, wherein said conductive elements are arranged under inductance spirals only.

8. The inductance structure of claim 1, wherein the inductance includes a plurality of spiral portions that together form a spiral; and said conductive elements each have an elongated shape and are arranged perpendicularly to a respective spiral portion under which the conductive elements are laid.

9. An inductance structure comprising:

a semiconductor substrate;

a spirally shaped inductance;

a plurality of distinct conductive elements formed between the inductance and the substrate; and a plurality of conductive tracks, each conductive track electrically coupling a respective one of the conductive elements to a contact point and arranged relative to the conductive elements and others of the conductive tracks such that a resultant of electromotive forces induced in the conductive elements by said inductance is substantially cancelled.

10. The inductance structure according to claim 9, wherein each of the conductive tracks substantially follows an axis of symmetry of the inductance.

11. The inductance structure according to claim 10, wherein the spirally shaped inductance further comprises a rectilinear spiral shape.

12. The inductance structure according to claim 11, wherein one or more of the conductive tracks are arranged along diagonal and median lines of said rectilinear spiral shape.

13. The inductance structure according to claim 9, wherein the spirally shaped inductance further comprises a substantially circular spiral shape.

14. The inductance structure according to claim 13, wherein the conductive tracks are arranged along radii of said substantially circular spiral shape.

15. A method for nulling inductance in an inductance structure, the method comprising:

providing a spirally shaped inductance;

providing a plurality of distinct conductive elements on a surface of a semiconductor substrate;

arranging a plurality of conductive tracks electrically interconnecting the conductive elements to a contact point and arranged such that a resultant electromotive force induced therein by the inductance is substantially null.

16. The method according to claim 15, further comprising forming the conductive elements and the conductive tracks on a substrate; and forming the inductance over the conductive elements and the conductive tracks.

17. The method according to claim 16, wherein the determining of each of the conductive elements and the conductive tracks further comprises calculating a mutual inductance coefficient between the inductance and one conductive track.

18. The method according to claim 17, wherein the spirally shaped inductance further comprises a rectilinear spiral shape; and one or more of the conductive tracks are arranged along diagonal and median lines of said rectilinear spiral shape.

19. The method according to claim 17, wherein the spirally shaped inductance further comprises a substantially circular spiral shape; and the conductive tracks are arranged along radii of said substantially circular spiral shape.

20. The method according to claim 17, wherein the calculating further comprises consideration of a plurality of system parameters.

21. The method according to claim 20, wherein the calculating further comprises employing a known electromagnetic simulation tool.

22. A method, comprising:

applying a varying current to an inductor formed on a semiconductor substrate; and shielding the substrate from capacitive coupling with the inductor;

the shielding step including:

grounding a contact point in a conductive plane, the plane being disposed between the inductor and the substrate, the plane being divided into a plurality of conductive elements; and grounding each of the plurality of conductive elements to the contact point via one of a plurality of conductive tracks, each of the plurality of conductive elements and each of the plurality of conductive tracks being disposed in the conductive plane such, that the resulting electromotive forces induced therein are substantially null.

* * * * *